(12) United States Patent
Zhou et al.

(10) Patent No.: US 12,651,895 B2
(45) Date of Patent: Jun. 9, 2026

(54) SELF-ENERGY-TAKING HYBRID DIRECT-CURRENT CIRCUIT BREAKER AND APPLICATION METHOD THEREFOR

(71) Applicants: STATE GRID SMART GRID RESEARCH INSTITUTE CO., LTD., Beijing (CN); STATE GRID CORPORATION OF CHINA, Beijing (CN)

(72) Inventors: Wandi Zhou, Beijing (CN); Zhiyuan He, Beijing (CN); Yuan Liu, Beijing (CN); Sheng Zhang, Beijing (CN); Chong Gao, Beijing (CN); Pengzhi Li, Beijing (CN)

(73) Assignees: STATE GRID SMART GRID RESEARCH INSTITUTE CO., LTD., Beijing (CN); STATE GRID CORPORATION OF CHINA, Beijing (CN)

( * ) Notice: Subject to any disclaimer, the term of this patent is extended or adjusted under 35 U.S.C. 154(b) by 204 days.

(21) Appl. No.: 18/713,990

(22) PCT Filed: Aug. 17, 2022

(86) PCT No.: PCT/CN2022/112946
§ 371 (c)(1),
(2) Date: May 28, 2024

(87) PCT Pub. No.: WO2023/124114
PCT Pub. Date: Jul. 6, 2023

(65) Prior Publication Data
US 2025/0023339 A1 Jan. 16, 2025

(30) Foreign Application Priority Data
Dec. 28, 2021 (CN) .......................... 202111626867.4

(51) Int. Cl.
*H02H 3/087* (2006.01)
*H03K 17/56* (2006.01)

(52) U.S. Cl.
CPC ............. *H02H 3/087* (2013.01); *H03K 17/56* (2013.01)

(58) Field of Classification Search
CPC ...... H01H 9/548; H01H 33/596; H02H 3/087; H02H 7/26; H03K 17/56
(Continued)

(56) References Cited

U.S. PATENT DOCUMENTS

2016/0329179 A1 11/2016 Kim

FOREIGN PATENT DOCUMENTS

| CN | 107834506 A | | 3/2018 |
|----|-------------|---|--------|
| CN | 207530515 U | * | 6/2018 |

(Continued)

OTHER PUBLICATIONS

Machine translation of Zhou et al. Chinese Patent Document CN 207530515 U Jun. 2018 (Year: 2018).*
(Continued)

*Primary Examiner* — Kevin J Comber
(74) *Attorney, Agent, or Firm* — Syncoda LLC; Feng Ma

(57) ABSTRACT

Disclosed in the present application are a self-energy-taking hybrid direct-current circuit breaker and an application method therefor. In the self-energy-taking hybrid direct-current circuit breaker, a breaking branch is connected to a through-current branch in parallel, a first end of a grounding branch is connected to the breaking branch, and a second end of the grounding branch is grounded. When a direct-current system operates stably, the through-current branch conducts a steady-state running current of the direct-current system, and when the direct-current system breaks down, a self-energy-taking capacitor in the breaking branch assists a
(Continued)

power electronic device in achieving the breaking of a fault current.

8 Claims, 14 Drawing Sheets

(58) Field of Classification Search
USPC ........................................................ 361/100
See application file for complete search history.

(56) References Cited

FOREIGN PATENT DOCUMENTS

| CN | 109861183 | A | * | 6/2019 | | |
| CN | 110350491 | A | | 10/2019 | | |
| CN | 111917107 | A | * | 11/2020 | ............. | H02H 3/066 |
| CN | 112865040 | A | | 5/2021 | | |
| CN | 113422359 | A | | 9/2021 | | |
| CN | 214314555 | U | | 9/2021 | | |
| CN | 113725831 | A | | 11/2021 | | |
| CN | 114336547 | A | | 4/2022 | | |
| CN | 114336550 | A | | 4/2022 | | |
| EP | 3321948 | A1 | | 5/2018 | | |
| WO | 2015090365 | A1 | | 6/2015 | | |

OTHER PUBLICATIONS

Machine translation of Guo et al. Chinese Patent Document CN 109861183 A Jun. 2019 (Year: 2019).*

Machine translation of Xu et al. Chinese Patent Document CN 111917107 A Jul. 2020 (Year: 2020).*

Supplementary European Search Report in the European application No. 22913399.6, mailed on Jan. 20, 2025. 13 pages.

International Search Report in the international application No. PCT/CN2022/112946, mailed on Oct. 25, 2022. 7 pages with English translation.

Written Opinion of the International Search Authority in the international application No. PCT/CN2022/112946, mailed on Oct. 25, 2022. 10 pages with English translation.

* cited by examiner

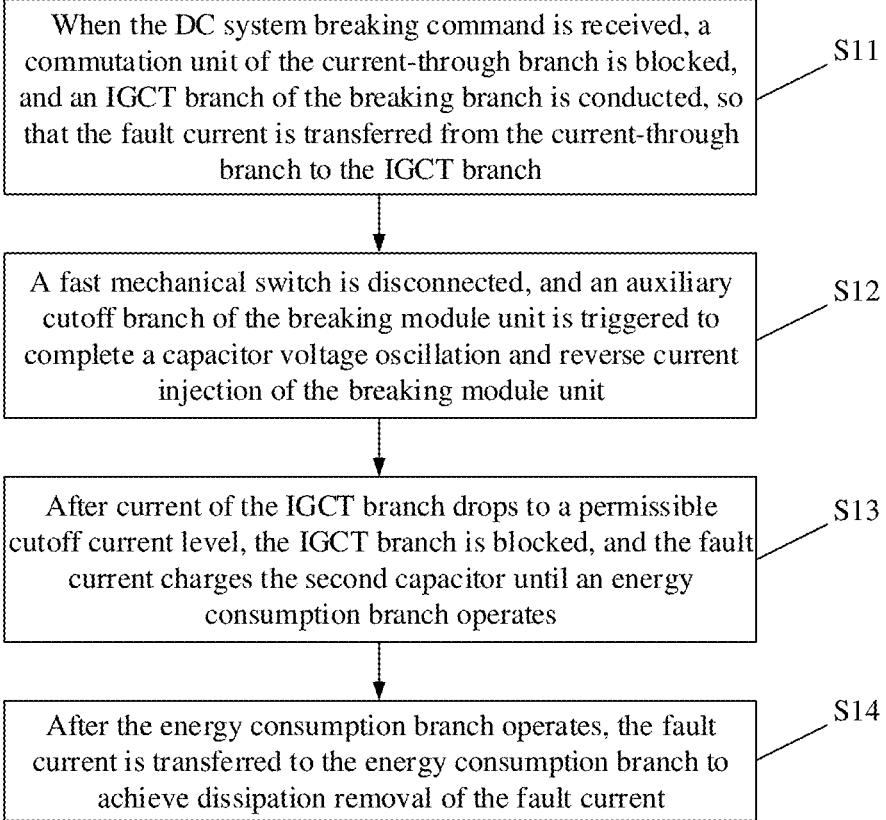

When the DC system breaking command is received, a commutation unit of the current-through branch is blocked, and an IGCT branch of the breaking branch is conducted, so that the fault current is transferred from the current-through branch to the IGCT branch ⟋ S11

A fast mechanical switch is disconnected, and an auxiliary cutoff branch of the breaking module unit is triggered to complete a capacitor voltage oscillation and reverse current injection of the breaking module unit ⟋ S12

After current of the IGCT branch drops to a permissible cutoff current level, the IGCT branch is blocked, and the fault current charges the second capacitor until an energy consumption branch operates ⟋ S13

After the energy consumption branch operates, the fault current is transferred to the energy consumption branch to achieve dissipation removal of the fault current ⟋ S14

FIG. 10

SELF-ENERGY-TAKING HYBRID DIRECT-CURRENT CIRCUIT BREAKER AND APPLICATION METHOD THEREFOR

CROSS-REFERENCE TO RELATED APPLICATIONS

This is a U.S. National Stage of International Application No. PCT/CN2022/112946 filed on Aug. 17, 2022, which claims priority to Chinese patent application No. 202111626867.4 filed on Dec. 28, 2021. The disclosures of the above-referenced applications are hereby incorporated by reference in their entirety.

TECHNICAL FIELD

The disclosure relates to the field of power electronic technology, and in particular to a self-energy-acquiring hybrid direct-current circuit breaker and an application method therefor.

BACKGROUND

High-voltage Direct-Current (DC) circuit breaker is one of the core devices for construction of multi-terminal and DC power grid, and the technical economy of the high-voltage DC circuit breaker directly affects the flexibility and extensibility of the application of the DC power grid. Currently, the hybrid high-voltage DC circuit breaker is an essential technology route of high-voltage DC breaking, which has characteristics such as a low loss, a high breaking capacity, flexible application and scalability, and the like. However, the hybrid DC circuit breaker is composed by a large number of fully-controlled Insulated Gate Bipolar Transistor (IGBT) components. On one hand, the breaking performance is limited by the level of breaking current of a single component, and there is a bottleneck of further enhancement. On the other hand, the overall cost of the device is high. In addition, in order to ensure the reliable operation of a large number of fully-controlled IGBTs arranged dispersedly at high potential, it is also necessary to configure a complex energy supply system and solve the problem of overvoltage isolation of up to hundreds of kilovolts (kV) against the ground and inside, which further increases the occupation and cost of the whole device and restricts reliability of the overall operation.

SUMMARY

The disclosure provides a self-energy-acquiring hybrid DC circuit breaker and an application method therefor, to solve the technical problems of the hybrid high-voltage DC circuit breaker technology in the related art, such as a limited breaking capacity, a relatively high cost of a single device, and a complex design of the energy supply system. A self-energy-acquiring hybrid DC circuit breaker and an application method therefor are provided with a low cost, simple energy supply, and a breaking capacity that is not restricted by the cutoff capacity of the device.

An embodiment of the disclosure provides a self-energy-acquiring hybrid DC circuit breaker.

The DC circuit breaker is configured to acquire energy from a DC system to assist a power electronic component to achieve current cutoff.

In the above solution, the DC circuit breaker may include a current-through branch, a breaking branch and a ground branch. The current-through branch and the breaking branch are connected in parallel, a first end of the ground branch is connected to the breaking branch, and a second end of the ground branch is grounded.

In the above solution, the current-through branch may include a mechanical switch and a commutation unit connected in series. The commutation unit is formed by fully-controlled components reversely connected in series, or a bridge module based on the fully-controlled components, or an electromagnetic coupling assembly.

In the above solution, the electromagnetic coupling assembly may be formed by a first capacitor, a coupling reactance, a first thyristor and a first diode. A first end of a primary side of the coupling reactance is connected to an end of the mechanical switch, and a second end of the primary side of the coupling reactance is connected to the DC system. A first end of a secondary side of the coupling reactance is connected to a first end of the first thyristor through the first capacitor, and a second end of the secondary side of the coupling reactance is connected to a second end of the first thyristor. The first thyristor and the first diode are reversely connected in parallel.

In the above solution, the breaking branch may include a full-bridge circuit formed based on a diode series valve, and a breaking module branch. An upper bridge arm and a lower bridge arm of the full-bridge circuit are reversely connected in parallel and then connected to the current-through branch in parallel. A first end of the breaking module branch is connected to a midpoint of the upper bridge arm of the full-bridge circuit. A second end of the breaking module branch is connected to a midpoint of the lower bridge arm of the full-bridge circuit, and the second end of the breaking module branch is further grounded through the ground branch.

In the above solution, the breaking module branch may include at least one breaking module unit. When the breaking module branch includes at least one breaking module unit, each of the at least one breaking module unit includes a respective Integrated Gate-Commutated Thyristor (IGCT) branch, a respective auxiliary cutoff branch and a respective energy consumption branch that are connected in parallel. Alternatively, when the breaking module branch includes multiple breaking module units, each of the multiple breaking module units includes a respective IGCT branch and a respective auxiliary cutoff branch connected in parallel, and all of the multiple breaking module units further collectively include a same energy consumption branch. Each of two ends of the energy consumption branch is connected to a respective one of the midpoint of the upper bridge arm and the midpoint of the lower bridge arm of the full-bridge circuit.

In the above solution, the auxiliary cutoff branch may include at least one second thyristor, at least one second capacitor, at least one inductor and at least one third thyristor. The at least one second thyristor, the at least one second capacitor and the at least one inductor are connected in series. The at least one third thyristor is connected in parallel to a series circuit formed by the at least one second capacitor and the at least one inductor connected in series. Alternatively, the auxiliary cutoff branch may include at least one second diode, the at least one second capacitor, the at least one inductor and the at least one third thyristor. The at least one second diode, the at least one second capacitor and the at least one inductor are connected in series. The at least one third thyristor is connected in parallel to a series circuit formed by the at least one second capacitor and the at least one inductor connected in series, or the at least one third thyristor and the at least one second diode are reversely connected in parallel.

In the above solution, the first end of the ground branch may be connected to a midpoint of a lower bridge arm of the breaking branch, and the second end of the ground branch may be grounded. The ground branch may be formed by a resistor.

An embodiment of the disclosure provides an application method of a self-energy-acquiring hybrid DC circuit breaker, and the method is based on the self-energy-acquiring hybrid DC circuit breaker. The method includes the following operations. In case of a steady state current-through operation, the DC circuit breaker completes energy acquisition from a system. When a DC system breaking command is received, fault current is transferred to a breaking branch by controlling operation states of internal components of the breaking branch and a current-through branch, and energy is stored from the system to assist a power electronic component of the breaking branch to complete current breaking.

In the above solution, a process that the fault current is transferred to the breaking branch by controlling the operation states of the internal components of the breaking branch and the current-through branch and the DC circuit breaker acquires the energy from the DC system to assist the power electronic component of the breaking branch to complete the current breaking may include the following operations. When the DC system breaking command is received, a commutation unit of the current-through branch is blocked, and an Integrated Gate-Commutated Thyristor (IGCT) branch of the breaking branch is conducted, so that the fault current is transferred from the current-through branch to the IGCT branch. A fast mechanical switch is disconnected, and an auxiliary cutoff branch of a breaking module unit is triggered, to complete a capacitor voltage oscillation and reverse current injection of the breaking module unit. After current of the IGCT branch drops to a permissible cutoff current level, the IGCT branch is blocked, and the fault current charges a second capacitor until an energy consumption branch operates. After the energy consumption branch operates, the fault current is transferred to the energy consumption branch to achieve dissipation removal of the fault current.

In the above solution, before the DC circuit breaker is put into operation, the method may further include the following operation. The current-through branch is broken, and the DC system completes charge of the breaking branch through a ground branch.

In the above solution, the application method of the self-energy-acquiring hybrid DC circuit breaker may further include the following operation. When the DC system operates in a steady state, the current-through branch maintains a conducting state and the breaking branch maintains a blocked state.

The technical solution of the disclosure has the following advantages.

1. According to the self-energy-acquiring hybrid DC circuit breaker and the application method therefor provided by the disclosure, the breaking branch and the current-through branch are connected in parallel, the first end of the ground branch is connected to the breaking branch, and the second end of the ground branch is grounded. When the DC system operates in the steady state, the current-through branch conducts a steady state operation current of the DC system. When the DC system malfunctions, a self-energyacquiring capacitor inside the breaking branch assists the power electronic components to achieve breaking of the fault current.

2. According to the self-energy-acquiring hybrid DC circuit breaker and the application method therefor provided by the disclosure, the capacitor of the breaking module unit completes pre-charge through the DC system, and fully-controlled components in each module may directly acquire energy from the capacitor of the module without adopting an additional energy supply apparatus. By adopting the IGCT components, the cost is low, and the design and composition of the overall energy supply system is greatly simplified, which may effectively reduce the cost and occupation of the device. By using a capacitor to assist cutoff, a fully-controlled component is only required to withstand the fault current, and the breaking capacity is not limited by the breaking level of the component. An IGCT component has a high overcurrent capacity, and may improve the breaking current capacity of the circuit breaker to tens of kiloamperes (kA).

BRIEF DESCRIPTION OF THE DRAWINGS

In order to illustrate the technical solutions in specific implementations of the disclosure or in the related art more clearly, the drawings to be used in descriptions of the specific implementations or the related art would be briefly introduced below. It is apparent that the drawings described below are some implementations of the disclosure, and other drawings may also be obtained by those ordinary skilled in the art according to these drawings without creative effort.

FIG. 10 is a flowchart of an application method of an exemplary hybrid DC circuit breaker provided by an embodiment of the disclosure.

DETAILED DESCRIPTION

Figure 1:
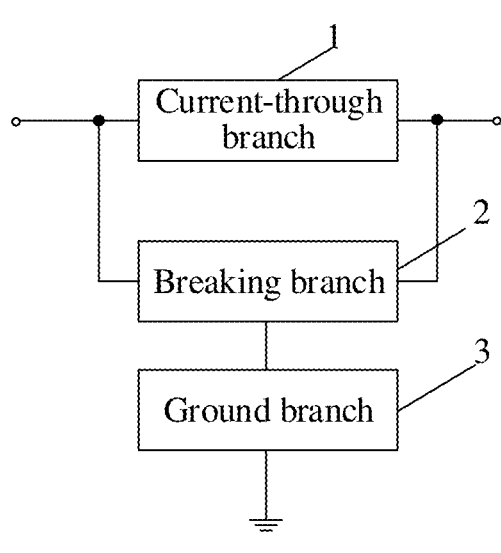
FIG. 1 is a first composition diagram of an exemplary hybrid DC circuit breaker provided by an embodiment of the disclosure.

The technical solutions of the disclosure would be described clearly and completely in the following in combination with the drawings. It is apparent that the described embodiments are a part of the embodiments of the disclosure and not all of the embodiments. Based on the embodiments of the disclosure, all other embodiments obtained by those of ordinary skill in the art without creative effort fall within the scope of protection of the disclosure.

In the description of the disclosure, it is to be noted that the terms "center", "upper", "lower", "left" "right", "vertical", "horizontal", "inside", "outside" or the like indicate orientations or positional relationships based on those shown in the drawings, which are intended only for facilitating the description of the disclosure and simplifying the description, and are not intended to indicate or imply that the apparatus or element referred to must have a particular orientation, or be constructed and operated in a particular orientation, and thus can not be understood as a limitation on the disclosure. Furthermore, the terms "first", "second" and "third" are only used for description, and cannot be understood as indicating or implying a relative importance.

In the description of the disclosure, it is to be noted that, unless otherwise explicitly specified and limited, the terms "install", "link" and "connect" should be understood in a broad sense. For example, it may be a fixed connection, a detachable connection, or a connection in one piece; it may be a mechanical connection or an electrical connection; it may be a direct connection or an indirect connection through an intermediate medium, or a connection within two elements; it may be a wireless connection or a wired connection. For those of ordinary skill in the art, the specific meanings of the above terms in the disclosure may be understood according to specific cases.

In addition, technical features involved in different implementations of the disclosure described below may be combined with each other as long as they do not constitute a conflict with each other.

Embodiment 1

An embodiment of the disclosure provides a self-energy-acquiring hybrid DC circuit breaker. The DC circuit breaker acquires energy from a DC system to assist a power electronic component to achieve current cutoff.

Specifically, as shown in FIG. 1, the hybrid DC circuit breaker includes a current-through branch 1, a breaking branch 2 and a ground branch 3.

In the embodiment of the disclosure, the current-through branch 1 is connected in series in the DC system. When the DC system operates normally, the current-through branch 1 is used to conduct a steady state operation current of the DC system, and an internal capacitor of the breaking branch 2 completes self energy acquisition through the system without an additional energy supply device being configured.

As shown in FIG. 1, the breaking branch 2 and the current-through branch 1 are connected in parallel. When the DC system malfunctions, the self-energy-acquiring capacitor assists the power electronic components inside the breaking branch 2 to achieve breaking of the fault current.

Specifically, when the DC system malfunctions, by controlling the operating state of the internal components of the breaking branch 2, the fault current is transferred to the breaking branch 2, and a voltage oscillation occurs in the internal capacitor of the breaking branch 2 and a current in a reverse direction reverse to the fault current is generated until the fault current is eliminated.

As shown in FIG. 1, a first end of the ground branch 3 is connected to the breaking branch 2, and a second end of the ground branch 3 is grounded. The ground branch 3 is used to limit the charge current of the DC system to the breaking branch 2 at the initial stage.

Specifically, before the DC circuit breaker is put into operation, the current-through branch 1 maintains a breaking state, and the DC system would charge the capacitor in the current-through branch 1 through the ground branch 3.

Figure 2:
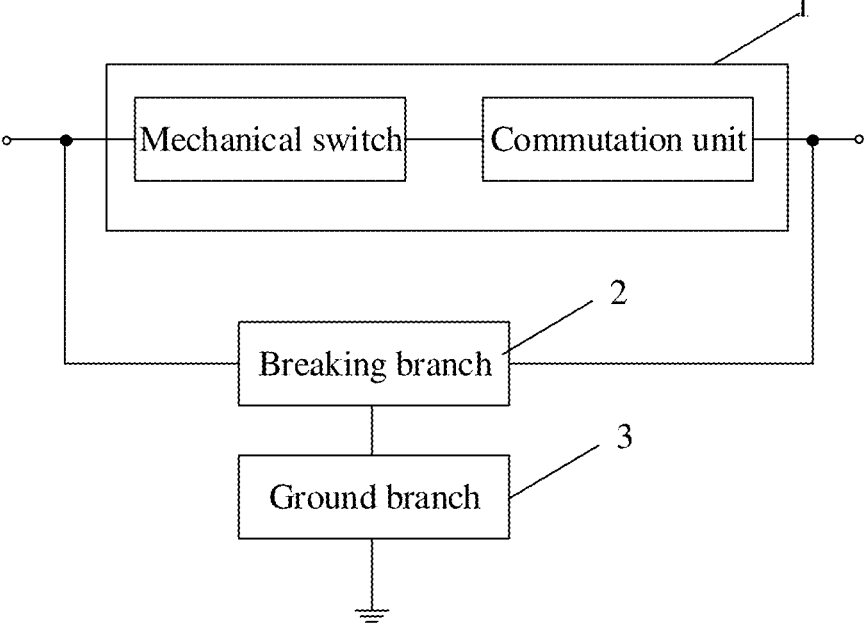
FIG. 2 is a second composition diagram of an exemplary hybrid DC circuit breaker provided by an embodiment of the disclosure.

In the embodiment of the disclosure, as shown in FIG. 2, the current-through branch 1 includes a mechanical switch and a commutation unit connected in series.

Figure 3A:
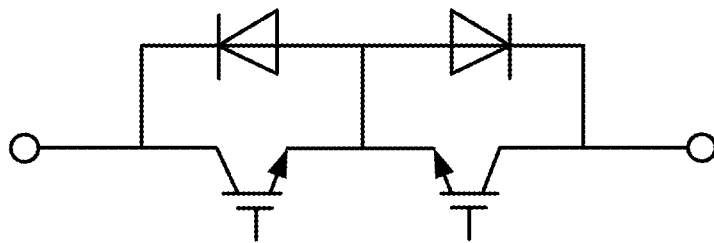
FIGS. 3A-3D are circuit structure diagrams of an exemplary commutation unit provided by an embodiment of the disclosure.
Figure 3B:
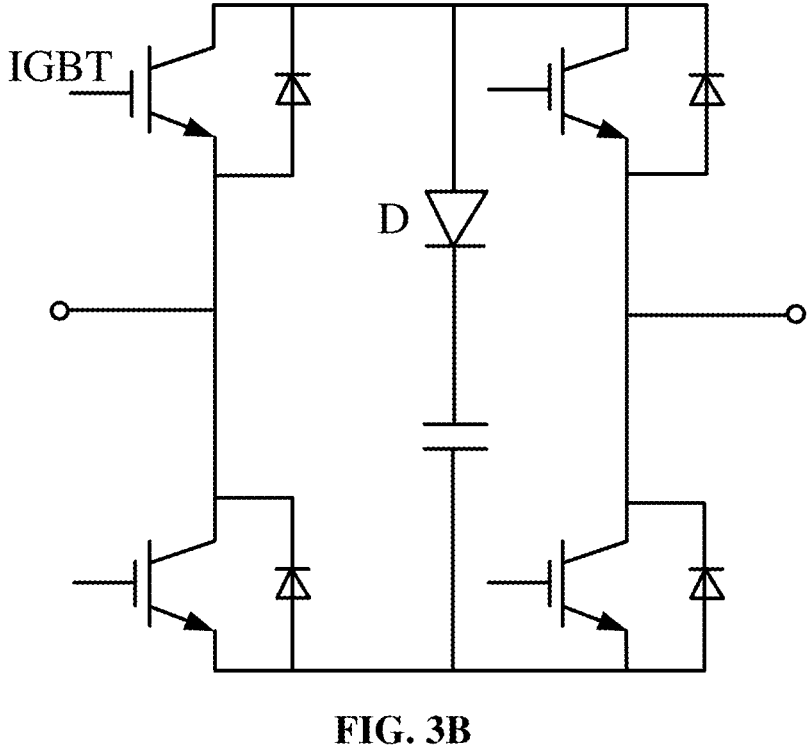
Figure 3C:
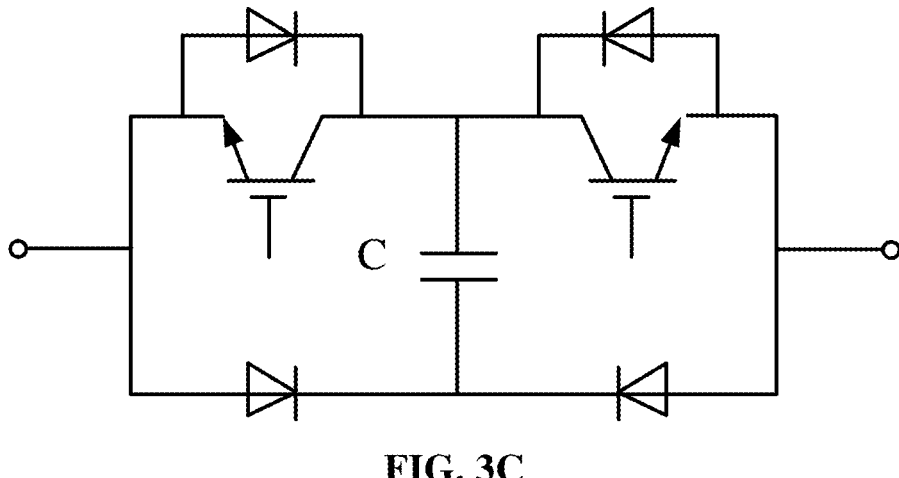
Figure 3D:
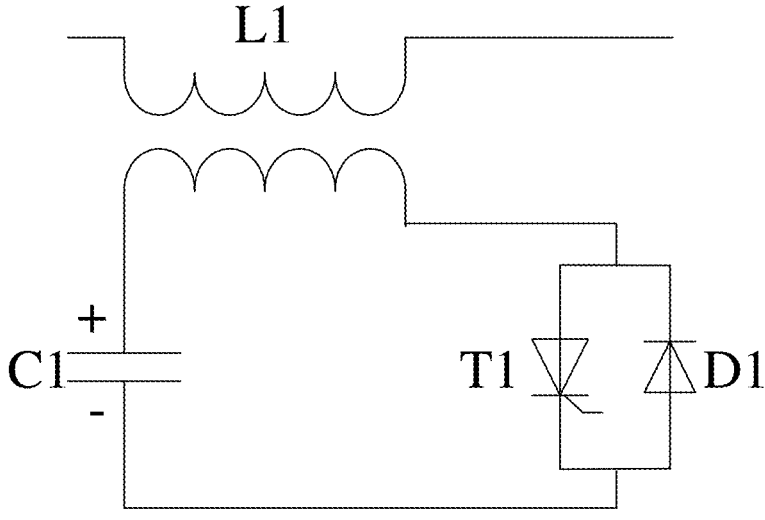

As shown in FIG. 3A, the commutation unit may be formed by fully-controlled components reversely connected in series. As shown in FIG. 3B and FIG. 3C, the commutation unit may be formed by a bridge module based on the fully-controlled components. As shown in FIG. 3D, the commutation unit may be formed by an electromagnetic coupling assembly.

As shown in FIG. 3D, the electromagnetic coupling assembly is formed by a first capacitor C1, a coupling reactance L1, a first thyristor T1 and a first diode D1. A first end of a primary side of the coupling reactance L1 is connected to an end of the mechanical switch, and a second end of the primary side of the coupling reactance L1 is connected to the DC system. A first end of a secondary side of the coupling reactance L1 is connected to a first end of the first thyristor T1 through the first capacitor C1, and a second end of the secondary side of the coupling reactance L1 is connected to a second end of the first thyristor T1. The first thyristor T1 and the first diode D1 are reversely connected in parallel.

Figure 4:
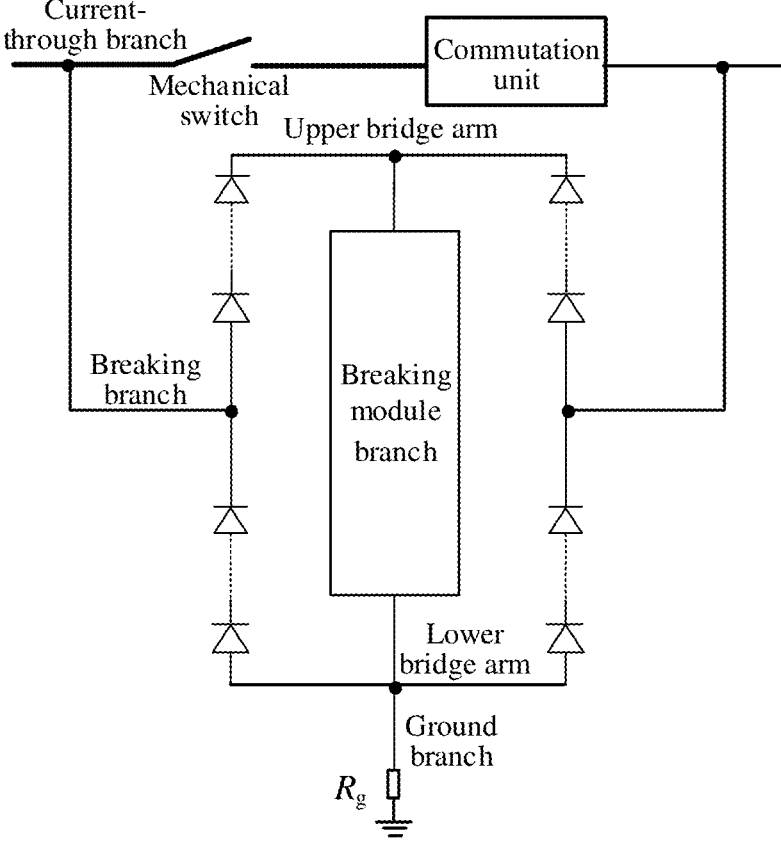
FIG. 4 is a third composition diagram of an exemplary hybrid DC circuit breaker provided by an embodiment of the disclosure.

In a specific embodiment, as shown in FIG. 4, the breaking branch 2 includes a breaking module branch and a full-bridge circuit formed based on a diode series valve. An upper bridge arm and a lower bridge arm of the full-bridge circuit are reversely connected in parallel and then connected to the current-through branch 1 (including the mechanical switch and the commutation unit) in parallel. A first end of the breaking module branch is connected to a midpoint of the upper bridge arm of the full-bridge circuit. A second end of the breaking module branch is connected to a midpoint of the lower bridge arm of the full-bridge circuit, and the second end of the breaking module branch is further grounded through the ground branch 3 (including a resistor $R_g$).

Figure 5:
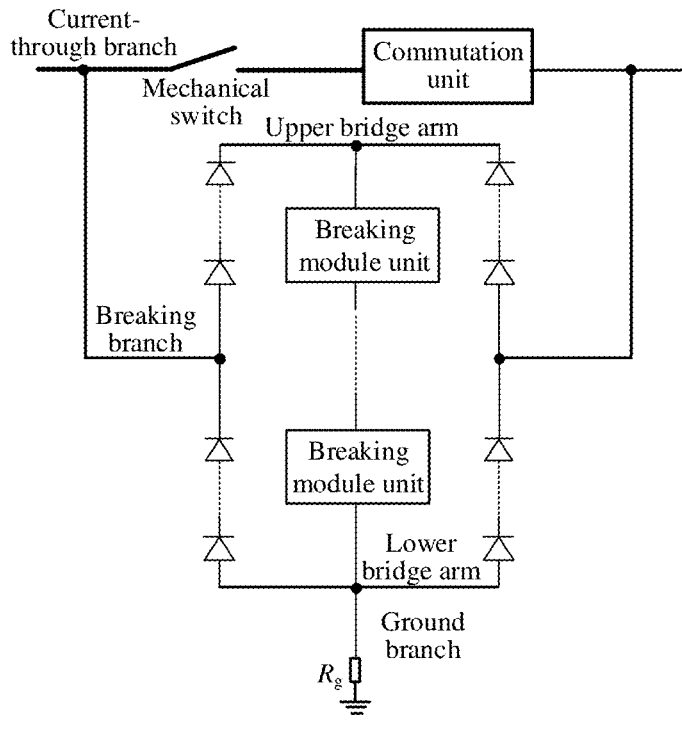
FIG. 5 is a fourth composition diagram of an exemplary hybrid DC circuit breaker provided by an embodiment of the disclosure.

In a specific embodiment, as shown in FIG. 5, the breaking module branch includes at least one breaking module unit. When the breaking module branch includes multiple breaking module units, the breaking module units are connected in series with each other.

Figure 6A:
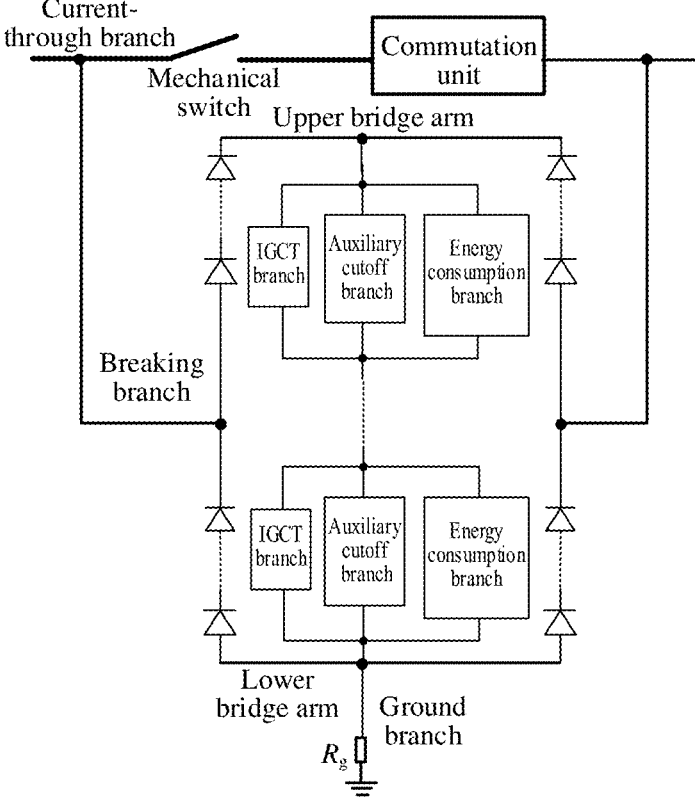
FIGS. 6A-6B are composition diagrams of an exemplary breaking module branch provided by an embodiment of the disclosure.

As shown in FIG. 6A, when the breaking module branch includes at least one breaking module unit, i.e., when the breaking module branch includes one or more breaking module units, each of the at least one breaking module unit includes a respective IGCT branch, a respective auxiliary cutoff branch and a respective energy consumption branch that are connected in parallel.

Figure 6B:
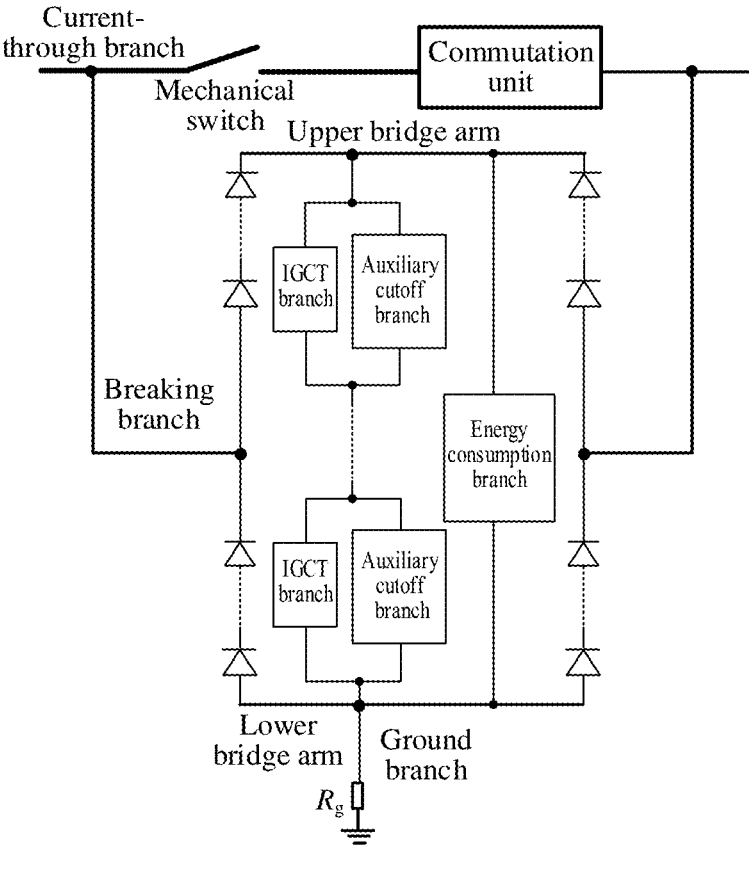

Alternatively, as shown in FIG. 6B, when the breaking module branch includes multiple breaking module units, i.e., when the breaking module branch includes two or more breaking module units, each of the multiple breaking module units includes a respective IGCT branch and a respective auxiliary cutoff branch connected in parallel. All of the multiple breaking module units further collectively include the same energy consumption branch, and each of two ends of the energy consumption branch is connected to a respective one of the midpoint of the upper bridge arm and the midpoint of the lower bridge arm of the full-bridge circuit.

Figure 7A:
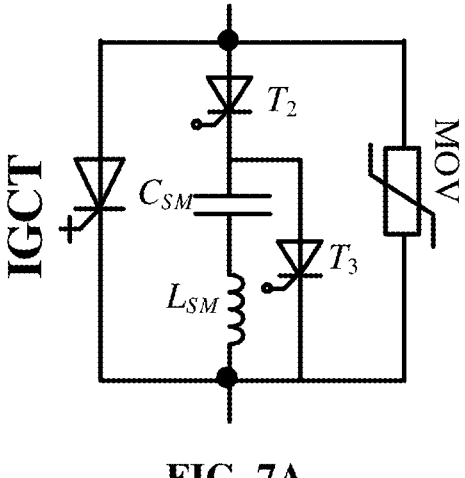
FIGS. 7A-7C are circuit structure diagrams of an exemplary breaking module unit provided by an embodiment of the disclosure.
Figure 7B:
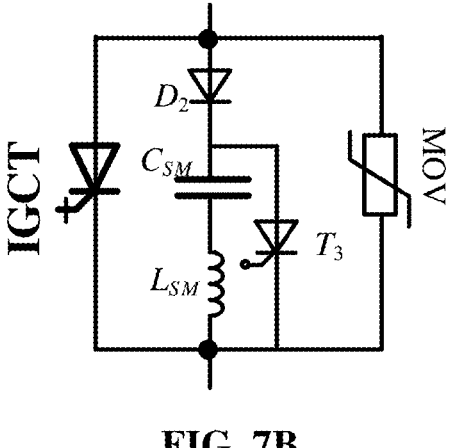
Figure 7C:
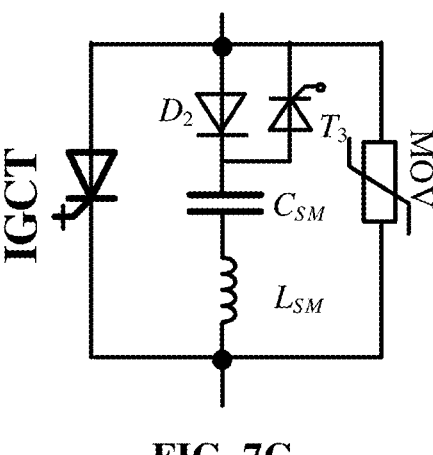

Specifically, the circuit structure of the auxiliary cutoff branch is as shown in FIGS. 7A-7C, and the MOV is the energy consumption branch.

Specifically, the auxiliary cutoff branch of the embodiment of the disclosure includes at least one second thyristor $T_2$, at least one second capacitor $C_{SM}$, at least one inductor $L_{SM}$ and at least one third thyristor $T_3$. As shown in FIG. 7A, the second thyristor $T_2$, the second capacitor $C_{SM}$ and the inductor $L_{SM}$ are connected in series. The third thyristor $T_3$ is connected in parallel to a series circuit formed by the second capacitor $C_{SM}$ and the inductor $L_{SM}$ connected in series. The MOV is connected in parallel to a series circuit formed by the second thyristor $T_2$ and the third thyristor $T_3$, and the MOV is further connected to the IGCT in parallel.

Specifically, the auxiliary cutoff branch of the embodiment of the disclosure may further include at least one second diode $D_2$, at least one second capacitor $C_{SM}$, at least one inductor $L_{SM}$ and at least one third thyristor $T_3$. As shown in FIG. 7B, the second diode $D_2$, the second capacitor $C_{SM}$ and the inductor $L_{SM}$ are connected in series, and the third thyristor $T_3$ is connected in parallel to a series circuit formed by the second capacitor $C_{SM}$ and the inductor $L_{SM}$ connected in series.

Specifically, the auxiliary cutoff branch of the embodiment of the disclosure may further include at least one second diode $D_2$, at least one second capacitor $C_{SM}$, at least one inductor $L_{SM}$ and at least one third thyristor $T_3$. As shown in FIG. 7C, the second diode $D_2$, the second capacitor $C_{SM}$ and the inductor $L_{SM}$ are connected in series, and the third thyristor $T_3$ and the second diode $D_2$ are reversely connected in parallel.

Embodiment 2

An embodiment of the disclosure provides an application method of a self-energy-acquiring hybrid DC circuit breaker, and the method is based on the self-energy-acquiring hybrid DC circuit breaker of the Embodiment 1. The application method includes an application method before the DC circuit breaker is put into operation, an application method when the DC system operates in a steady state, and an application method when the DC system malfunctions.

(1) The application method before the DC circuit breaker is put into operation includes the following operation. A current-through branch is broken, and the DC system completes charge of a breaking branch through a ground branch.

Figure 8:
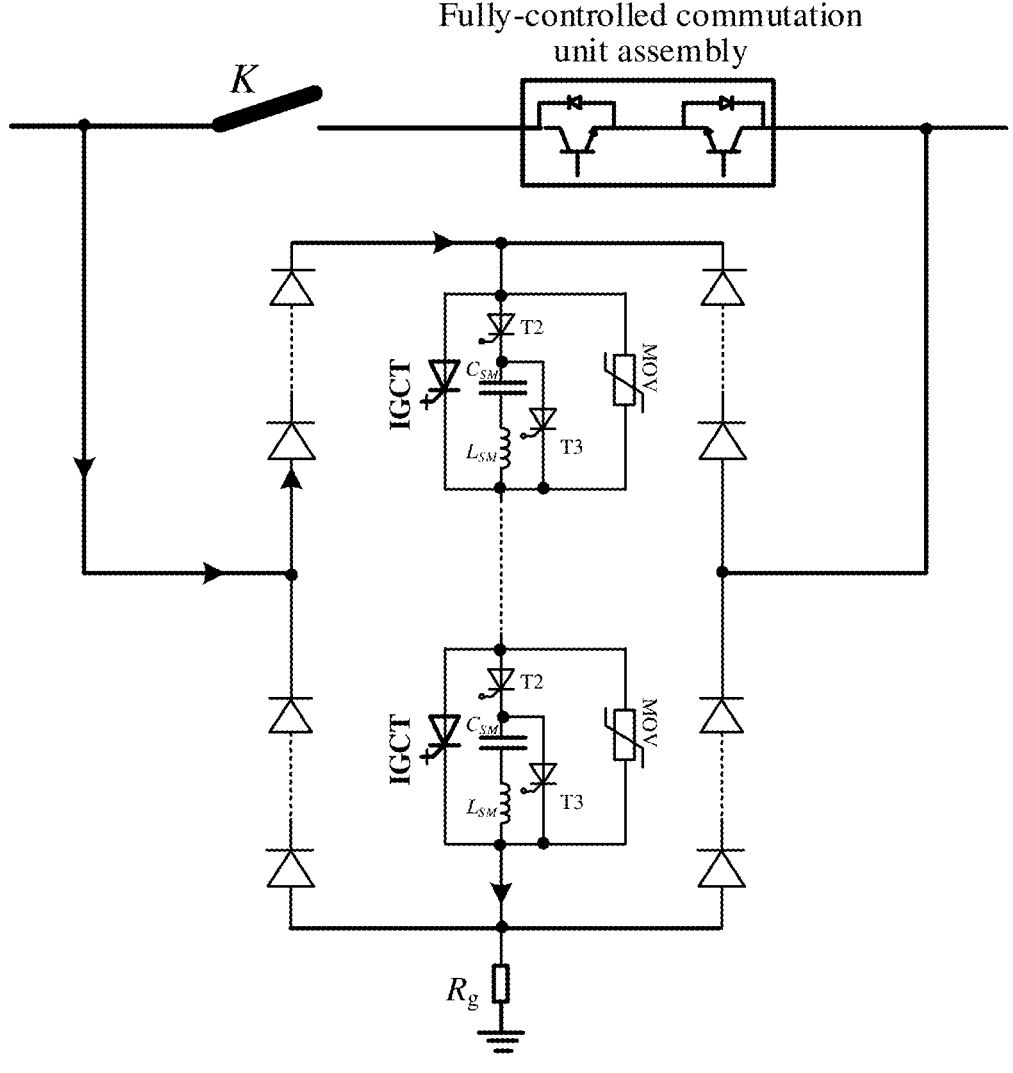
FIG. 8 is a diagram of a current flow before an exemplary hybrid DC circuit breaker provided by an embodiment of the disclosure is put into operation.

Specifically, before the DC circuit breaker is put into operation, as shown in FIG. 8, the current-through branch maintains a disconnected state (the mechanical switch K is switched off), and the mechanical switch K and the fully-controlled commutation unit assembly are connected in series. The DC system charges a second capacitor $C_{SW}$ of the breaking branch to achieve self energy acquisition of the capacitor. An auxiliary cutoff branch is exemplified by the circuit structure shown in FIG. 7A.

(2) The application method when the DC system operates in the steady state includes the following operation. When the DC system operates in the steady state, the current-through branch maintains a conducting state and the breaking branch maintains a blocked state.

Figure 9:
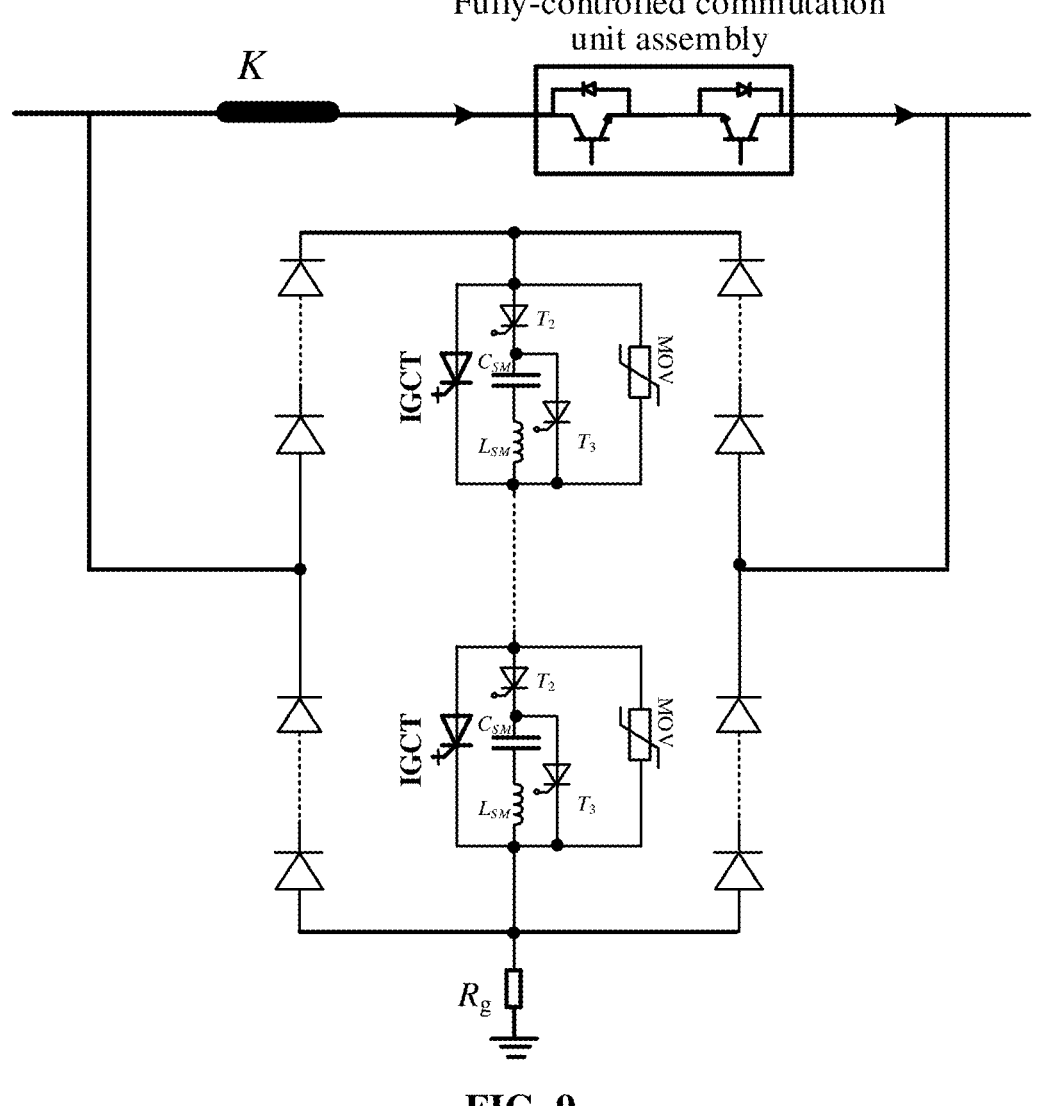
FIG. 9 is a diagram of a current flow when an exemplary DC system provided by an embodiment of the disclosure operates in a steady state.

Specifically, the breaking module unit shown in FIG. 7A is taken as an example. As shown in FIG. 9, when the DC system operates in the steady state, the mechanical switch (referred to as K, K is connected to the fully-controlled commutation unit assembly in series) is switched on, the current-through branch is disconnected, and current only flows through the current-through branch.

(3) The application method when the DC system malfunctions includes the following operation. When a DC system breaking command is received, fault current is transferred to the breaking branch by controlling operation states of internal components of the breaking branch and the current-through branch, and the energy stored (the self-energy-acquiring capacitor) from the system to assist a power electronic component of the breaking branch to complete current breaking.

Specifically, as shown in FIG. 10, the application method when the DC system malfunctions includes the following operations.

In operation S11, when the DC system breaking command is received, a commutation unit of the current-through branch is blocked, and an IGCT branch of the breaking branch is conducted, so that the fault current is transferred from the current-through branch to the IGCT branch.

Figure 11:
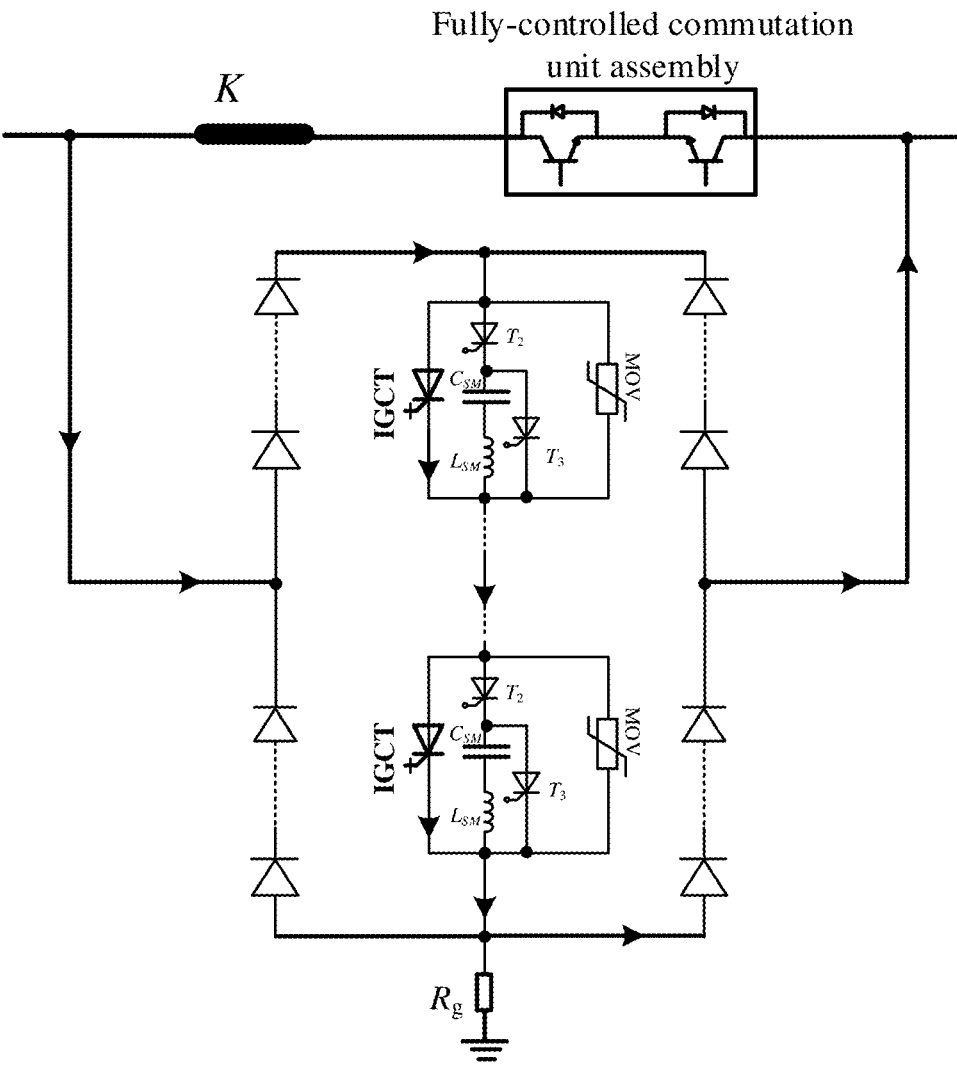
FIGS. 11-15 are diagrams of a current flow of a process that a fault current is consumed when an exemplary DC system provided by an embodiment of the disclosure malfunctions.

Specifically, the breaking module unit shown in FIG. 7A is taken as an example. As shown in FIG. 11, when the breaking command is received, firstly, the commutation unit (the fully-controlled commutation unit assembly) is blocked, the IGCT branch is conducted, and the mechanical switch (K) maintains a switched-on state. In this way, the fault current is transferred from the current-through branch to the breaking branch, and flows to the right side of the DC line through the IGCT branch of each breaking module unit.

In operation S12, a fast mechanical switch is disconnected, and an auxiliary cutoff branch of the breaking module unit is triggered, to complete a capacitor voltage oscillation and reverse current injection of the breaking module unit.

Figure 12:
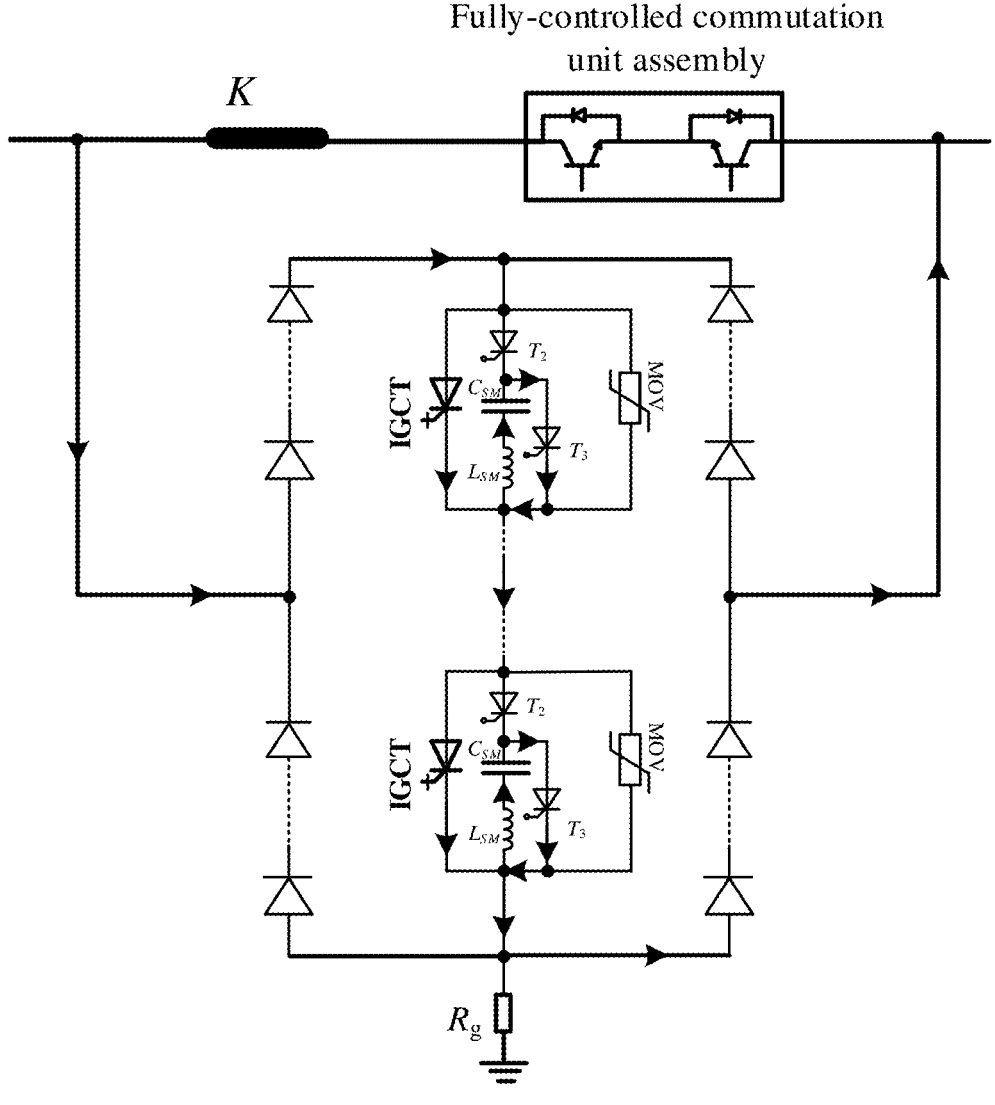
Figure 13:
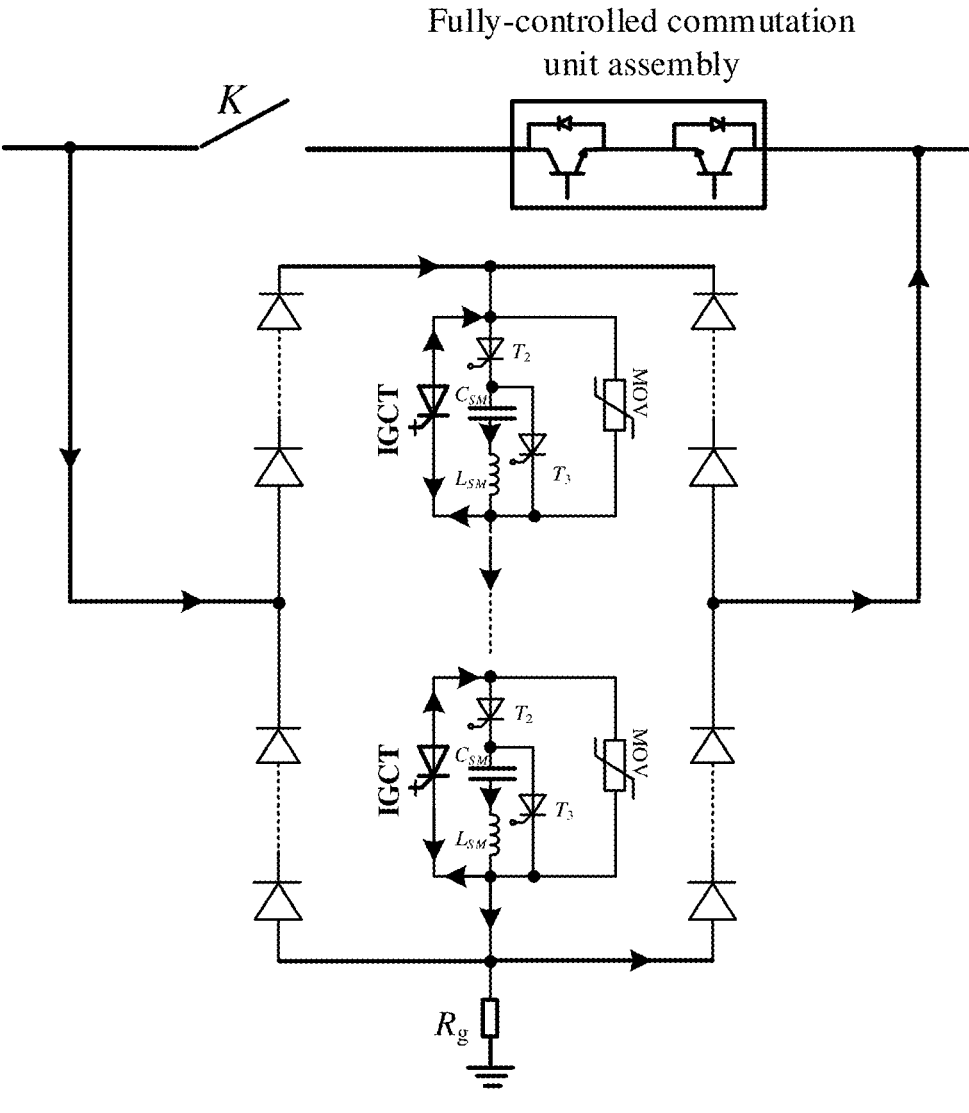

Specifically, the breaking module unit shown in FIG. 7A is taken as an example. As shown in FIG. 12, after the fault current is transferred to the breaking branch, the fast mechanical switch is switched off, and the third thyristor $T_3$ of the auxiliary cutoff branch of the breaking module unit is triggered. At this time, the fault current flows through the IGCT branch, and also flows through $T_3$ to charge the second capacitor $C_{SW}$, to complete the capacitor voltage oscillation of the module. As shown in FIG. 13, when the opening distance of the mechanical switch is enough to withstand a transient breaking voltage, the second thyristor $T_2$ of the auxiliary cutoff branch of the breaking module unit is triggered. At this time, the second capacitor $C_{SW}$ discharges to inject a reverse current into the IGCT branch.

In operation S13, after current of the IGCT branch drops to a permissible cutoff current level, the IGCT branch is blocked, and the fault current charges the second capacitor until an energy consumption branch operates.

Figure 14:
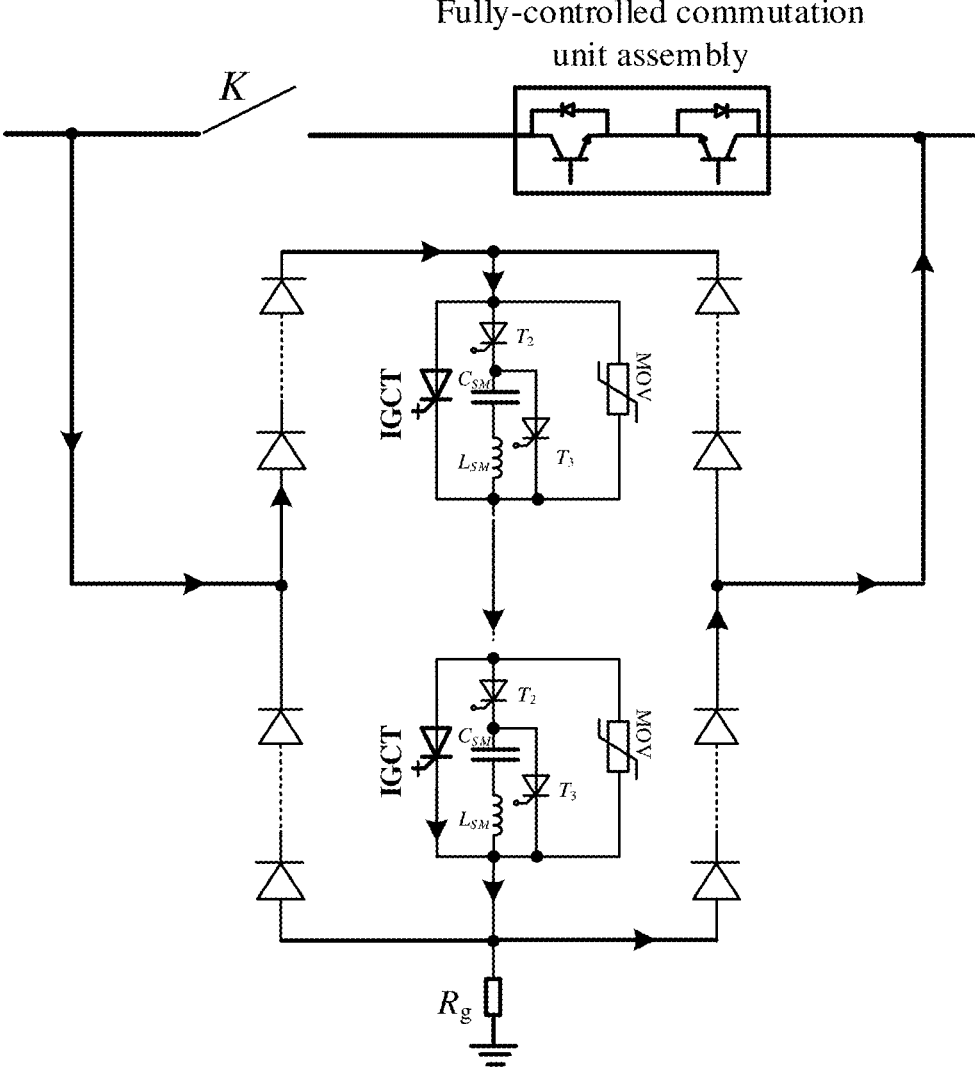

Specifically, the breaking module unit shown in FIG. 7A is taken as an example. As shown in FIG. 14, after the IGCT is blocked, the fault current charges the second capacitor $C_{SW}$ until an MOV operates.

In operation S14, after the energy consumption branch operates, the fault current is transferred to the energy consumption branch to achieve dissipation removal of the fault current.

Figure 15:
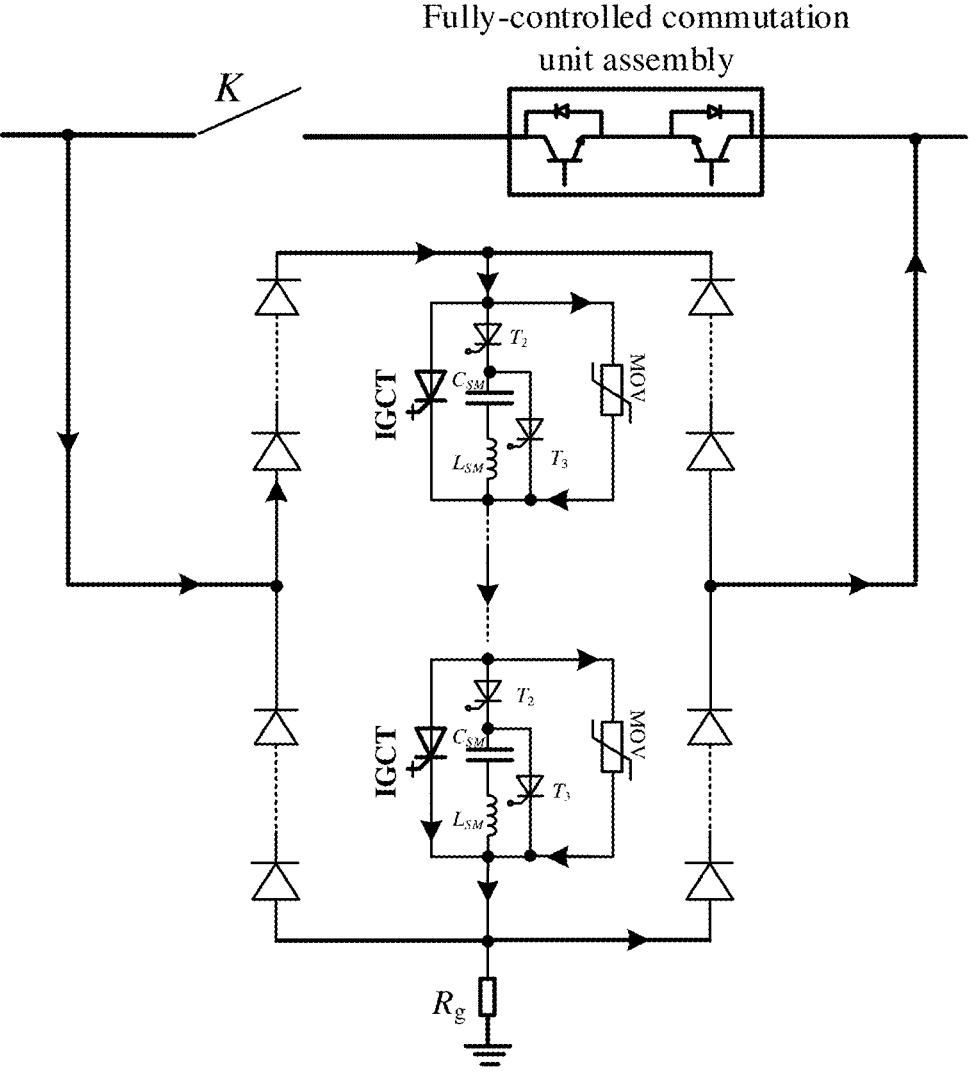

Specifically, the breaking module unit shown in FIG. 7A is taken as an example. As shown in FIG. 15, after the energy consumption branch operates, the fault current is transferred to the energy consumption branch and only flows through the MOV, and the MOV consumes the fault current.

It is apparent that the above embodiments are only examples for the purpose of clear illustration, and are not a limitation on the implementations. For those of ordinary skill in the art, other variations or changes in different forms may be made on the basis of the above illustration. It is neither necessary nor possible to exhaust all of the implementations herein. The obvious variations or changes derived therefrom still fall within the scope of protection of the disclosure.

INDUSTRIAL APPLICABILITY

The disclosure provides a self-energy-acquiring hybrid DC circuit breaker and an application method therefor. A breaking branch is connected to a current-through branch in parallel, a first end of a ground branch is connected to the breaking branch, and a second end of the ground branch is grounded. When a DC system operates in a steady state, the current-through branch conducts a steady state operation current of the DC system. When the DC system malfunctions, a self-energy-acquiring capacitor inside the breaking branch assists power electronic components to achieve breaking of fault current. The capacitor of the breaking module unit completes pre-charge through the DC system, and fully-controlled components in each module may acquire energy from the capacitor of the module without adopting an additional energy supply apparatus. By adopting IGCT components, the cost is low, and the design and composition of the overall energy supply system is greatly simplified, which may effectively reduce the cost and occupation of the device. By using a capacitor to assist cutoff, a fully-controlled component is only required to withstand the fault current, and the breaking capacity is not limited by the breaking level of the component. An IGCT component has a high overcurrent capacity, and may improve the breaking current capacity of the circuit breaker to tens of kA.

The invention claimed is:

1. A self-energy-acquiring hybrid Direct-Current (DC) circuit breaker, wherein the DC circuit breaker is configured to acquire energy from a DC system to assist a power electronic component to achieve current cutoff, wherein the DC circuit breaker comprises a current-through branch, a breaking branch and a ground branch, and the current-through branch and the breaking branch are connected in parallel, a first end of the ground branch is connected to the breaking branch, and a second end of the ground branch is grounded, wherein the current-through branch is configured to conduct a steady state operation current of the DC system, and the ground branch comprises a resistor;

wherein the breaking branch comprises a full-bridge circuit formed based on a diode series valve, and a breaking module branch; wherein an upper bridge arm and a lower bridge arm of the full-bridge circuit are reversely connected in parallel and then connected to the current-through branch in parallel; and a first end of the breaking module branch is connected to a midpoint of the upper bridge arm of the full-bridge circuit, a second end of the breaking module branch is connected to a midpoint of the lower bridge arm of the full-bridge circuit, and the second end of the breaking module branch is further grounded through the ground branch;

characterized in that the breaking module branch comprises at least one breaking module unit, each of the at least one breaking module unit comprises a respective Integrated Gate-Commutated Thyristor (IGCT) branch, a respective auxiliary cutoff branch and a respective energy consumption branch that are connected in parallel;

wherein the auxiliary cutoff branch comprises at least one first thyristor, at least one first capacitor, at least one inductor and at least one second thyristor, wherein the at least one first thyristor, the at least one first capacitor and the at least one inductor are connected in series, and the at least one second thyristor is connected in parallel to a series circuit formed by the at least one first capacitor and the at least one inductor connected in series;

wherein the current-through branch comprises a mechanical switch and a commutation unit connected in series; and the commutation unit is formed by fully-controlled components reversely connected in series, or formed by a bridge module based on the fully-controlled components, or formed by an electromagnetic coupling assembly.

2. The self-energy-acquiring hybrid DC circuit breaker of claim 1, wherein the DC circuit breaker is configured to:

break the current-through branch to cause the DC system to charge the at least one first capacitor through the ground branch;

when a DC system breaking command is received, block the commutation unit of the current-through branch, and conduct the IGCT branch of the breaking branch, so as to transfer fault current from the current-through branch to the IGCT branch of the breaking branch;

after the fault current is transferred to the breaking branch, switch off the mechanical switch, and trigger the at least one second thyristor of the auxiliary cutoff branch, so as to complete capacitor voltage oscillation of the at least one breaking module unit;

when an opening distance of the mechanical switch is enough to withstand a transient breaking voltage, trigger the at least one first thyristor of the auxiliary cutoff branch, so that the at least one first capacitor discharges to inject a reverse current into the IGCT branch; and after a current of the IGCT branch drops to a permissible cutoff current level, block the IGCT branch, so that the fault current charges the at least one first capacitor until the energy consumption branch operates.

3. The self-energy-acquiring hybrid DC circuit breaker of claim 1, wherein the electromagnetic coupling assembly is formed by a second capacitor, a coupling reactance, a third thyristor and a first diode;

wherein a first end of a primary side of the coupling reactance is connected to an end of the mechanical switch, a second end of the primary side of the coupling reactance is connected to the DC system, a first end of a secondary side of the coupling reactance is connected to a first end of the third thyristor through the second capacitor, and a second end of the secondary side of the coupling reactance is connected to a second end of the third thyristor; and the third thyristor and the first diode are reversely connected in parallel.

4. The self-energy-acquiring hybrid DC circuit breaker of claim 1, wherein the first end of the ground branch is connected to a midpoint of a lower bridge arm of the breaking branch, the second end of the ground branch is grounded, and the ground branch is formed by a resistor.

5. An application method of a self-energy-acquiring hybrid Direct-Current (DC) circuit breaker based on the self-energy-acquiring hybrid DC circuit breaker of claim 1, comprising:

in case of a steady state current-through operation, completing, by the DC circuit breaker, energy acquisition from a system; when the DC system breaking command is received, transferring fault current to the breaking branch by controlling operation states of internal components of the breaking branch and the current-through branch, and storing energy from the system to assist a power electronic component of the breaking branch to complete current breaking.

6. The application method of the self-energy-acquiring hybrid DC circuit breaker of claim 5, wherein a process of transferring the fault current to the breaking branch by controlling the operation states of the internal components of the breaking branch and the current-through branch, and acquiring, by the DC circuit breaker, the energy from the DC system to assist the power electronic component of the breaking branch to complete the current breaking comprises:

when the DC system breaking command is received, blocking the commutation unit of the current-through branch, and conducting an Integrated Gate-Commutated Thyristor (IGCT) the IGCT branch of the breaking branch, so that the fault current is transferred from the current-through branch to the IGCT branch;

disconnecting a fast mechanical switch, and triggering an auxiliary cutoff branch of a breaking module unit, to complete the capacitor voltage oscillation and reverse current injection of the breaking module unit;

after current of the IGCT branch drops to the permissible cutoff current level, blocking the IGCT branch, and charging, by the fault current, the at least one first capacitor until an energy consumption branch operates; and after the energy consumption branch operates, transferring the fault current to the energy consumption branch to achieve dissipation removal of the fault current.

7. The application method of the self-energy-acquiring hybrid DC circuit breaker of claim 5, wherein before the DC circuit breaker is put into operation, the method further comprises:

breaking the current-through branch, and completing, by the DC system, charge of the breaking branch through a ground branch.

8. The application method of the self-energy-acquiring hybrid DC circuit breaker of claim 5, further comprising:

when the DC system operates in a steady state, the current-through branch maintains a conducting state and the breaking branch maintains a blocked state.

\* \* \* \* \*